United States Patent
Alsmeier

(10) Patent No.: US 8,445,347 B2
(45) Date of Patent: May 21, 2013

(54) 3D VERTICAL NAND AND METHOD OF MAKING THEREOF BY FRONT AND BACK SIDE PROCESSING

(75) Inventor: Johann Alsmeier, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 167 days.

(21) Appl. No.: 13/083,775

(22) Filed: Apr. 11, 2011

(65) Prior Publication Data
US 2012/0256247 A1 Oct. 11, 2012

(51) Int. Cl.
*H01L 21/8247* (2006.01)

(52) U.S. Cl.
USPC .... 438/264; 438/594; 257/316; 257/321.422; 257/E21.681; 257/E27.103

(58) Field of Classification Search
USPC .................. 438/264, 594; 257/316, E27.103, 257/E21.422, E21.681
See application file for complete search history.

(56) References Cited

U.S. PATENT DOCUMENTS

| | | | |
|---|---|---|---|
| 7,005,350 B2 | 2/2006 | Walker et al. | |
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,746,680 B2 | 6/2010 | Scheuerlein et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,053,829 B2 * | 11/2011 | Kang et al. | 257/326 |
| 8,187,936 B2 * | 5/2012 | Alsmeier et al. | 438/264 |
| 8,193,054 B2 * | 6/2012 | Alsmeier | 438/216 |
| 2007/0252201 A1 | 11/2007 | Kito et al. | |
| 2008/0173928 A1 * | 7/2008 | Arai et al. | 257/316 |
| 2009/0283819 A1 * | 11/2009 | Ishikawa et al. | 257/324 |
| 2009/0294828 A1 * | 12/2009 | Ozawa et al. | 257/319 |
| 2010/0044778 A1 * | 2/2010 | Seol et al. | 257/326 |
| 2010/0112769 A1 * | 5/2010 | Son et al. | 438/261 |
| 2010/0120214 A1 * | 5/2010 | Park et al. | 438/287 |
| 2010/0148237 A1 | 6/2010 | Kito | |
| 2010/0155810 A1 * | 6/2010 | Kim et al. | 257/316 |
| 2010/0181610 A1 * | 7/2010 | Kim et al. | 257/314 |
| 2010/0207193 A1 | 8/2010 | Tanaka | |

(Continued)

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Zandra Smith
*Assistant Examiner* — Toniae Thomas
(74) *Attorney, Agent, or Firm* — The Marbury Law Group PLLC

(57) ABSTRACT

Monolithic three dimensional NAND strings and methods of making. The method includes both front side and back side processing. Using the combination of front side and back side processing, a NAND string can be formed that includes an air gap between the floating gates in the NAND string. The NAND string may be formed with a single vertical channel. Alternatively, the NAND string may have a U shape with two vertical channels connected with a horizontal channel.

14 Claims, 8 Drawing Sheets

U.S. PATENT DOCUMENTS

| | | | |
|---|---|---|---|
| 2010/0320528 A1* | 12/2010 | Jeong et al. | 257/324 |
| 2011/0076819 A1* | 3/2011 | Kim et al. | 438/279 |
| 2011/0266606 A1* | 11/2011 | Park et al. | 257/314 |
| 2011/0298013 A1* | 12/2011 | Hwang et al. | 257/208 |

OTHER PUBLICATIONS

Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-shaped BiCS Flash Memory," 2009 Symposium on VLSI Technology Digest of Technical Papers, pp. 22-23.

U.S. Appl. No. 12/827,577, "Ultrahigh Density Vertical NAND Memory Device and Method of Making Thereof,", filed Jun. 30, 2010.

U.S. Appl. No. 12/827,869, "Ultrahigh Density Vertical NAND Memory Device and Method of Making Thereof,", filed Jun. 30, 2010.

U.S. Appl. No. 12/827,761, "Ultrahigh Density Vertical NAND Memory Device and Method of Making Thereof,", filed Jun. 30, 2010.

U.S. Appl. No. 12/827,947, "Ultrahigh Density Vertical NAND Memory Device and Method of Making Thereof,", filed Jun. 30, 2010.

Endoh et al., "Novel Ultra High Density Memory With a Stacked-Surrounding Gate Transistor (S-SGT) Structured Cell", IEDM Proc. (2001) 33-36.

International Search Report & Written Opinion issued in PCT Application No. PCT/US2012/032870, mailed on Jun. 27, 2012.

* cited by examiner

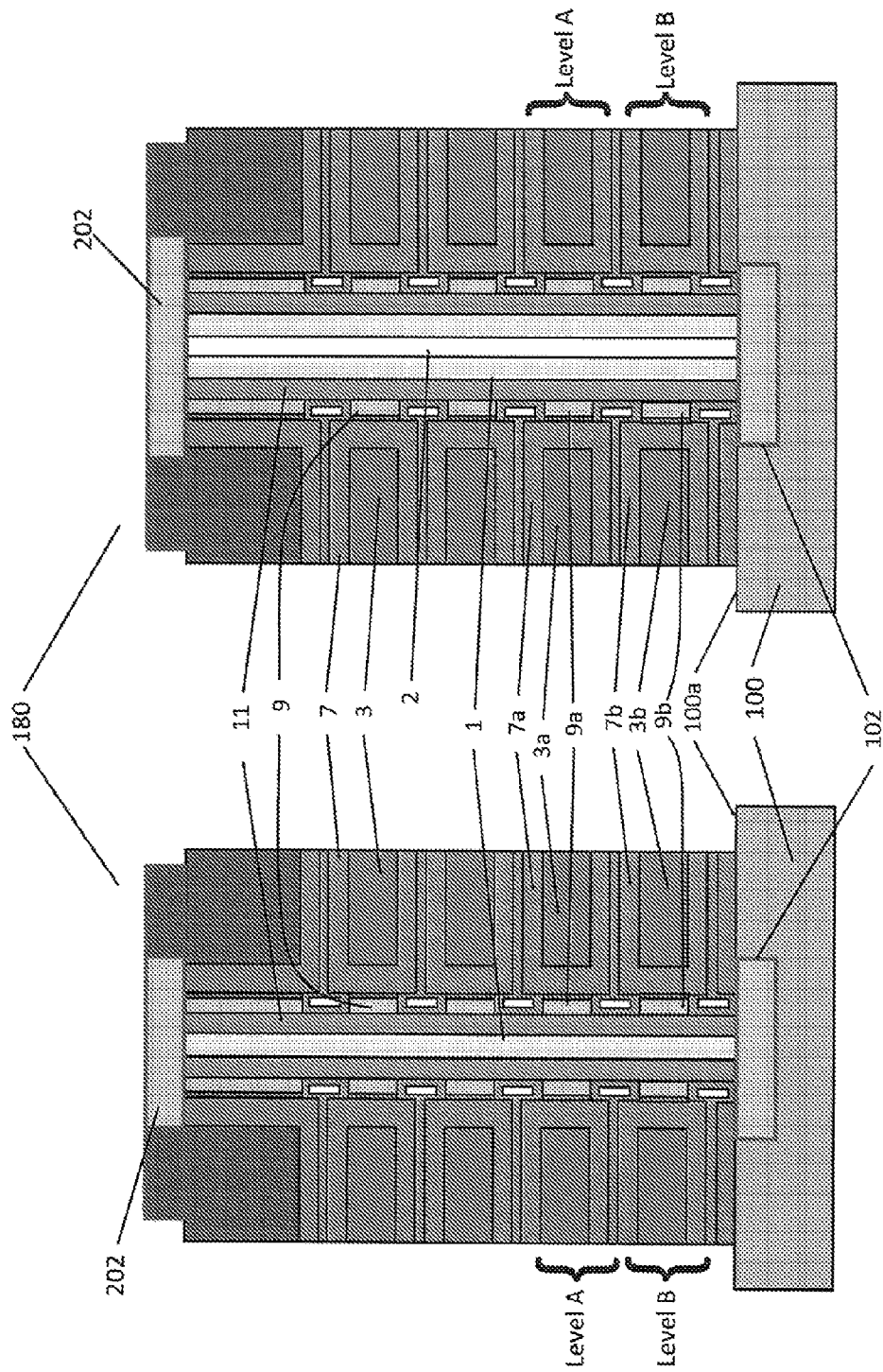

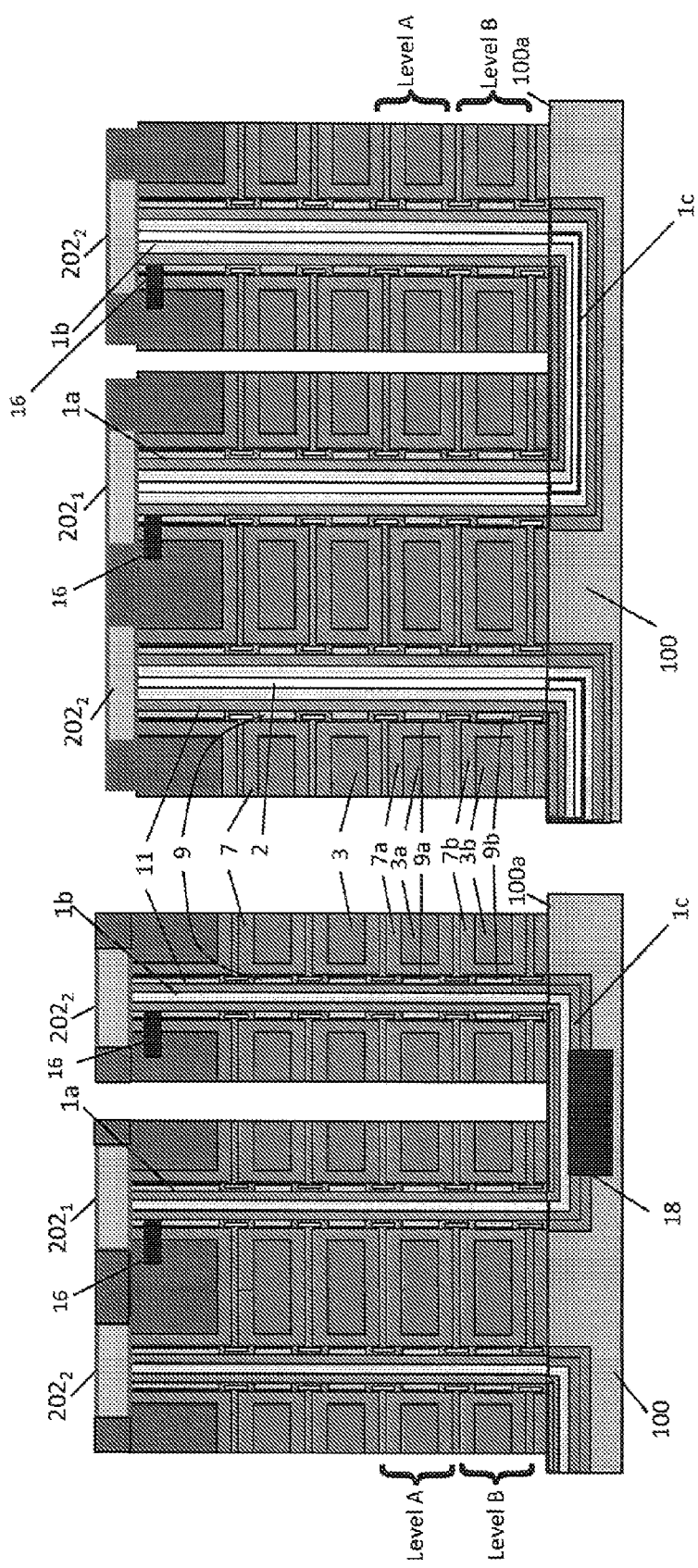

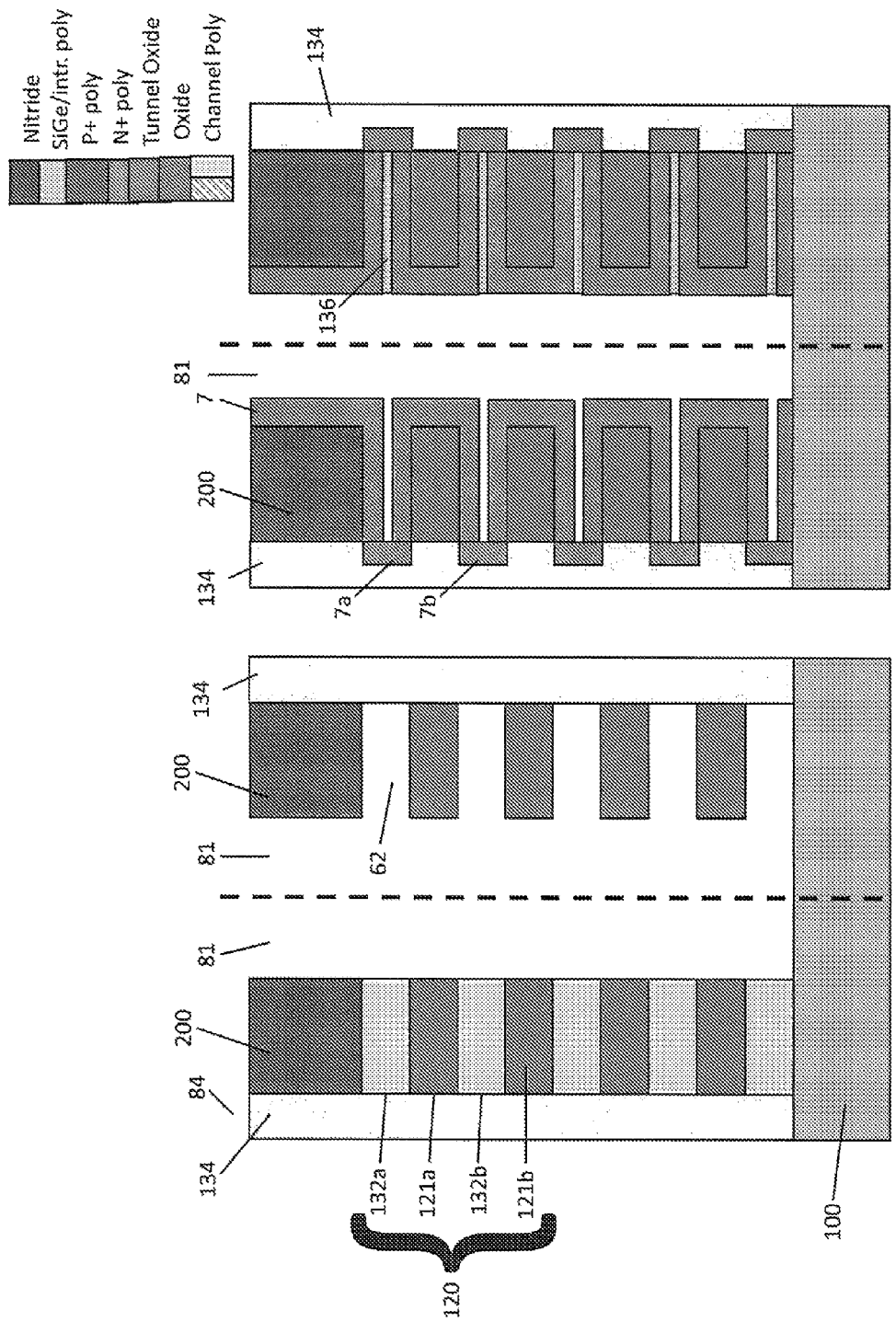

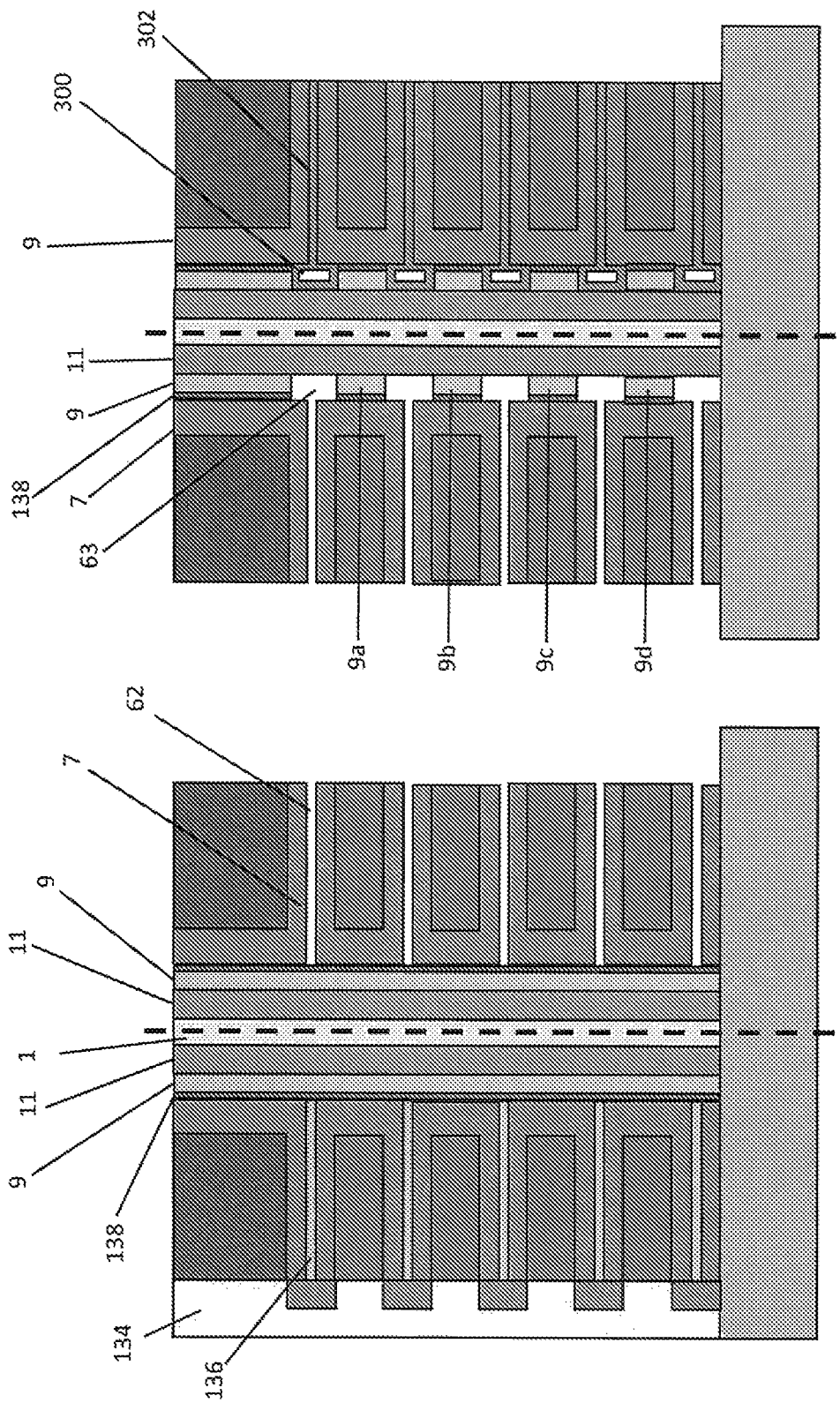

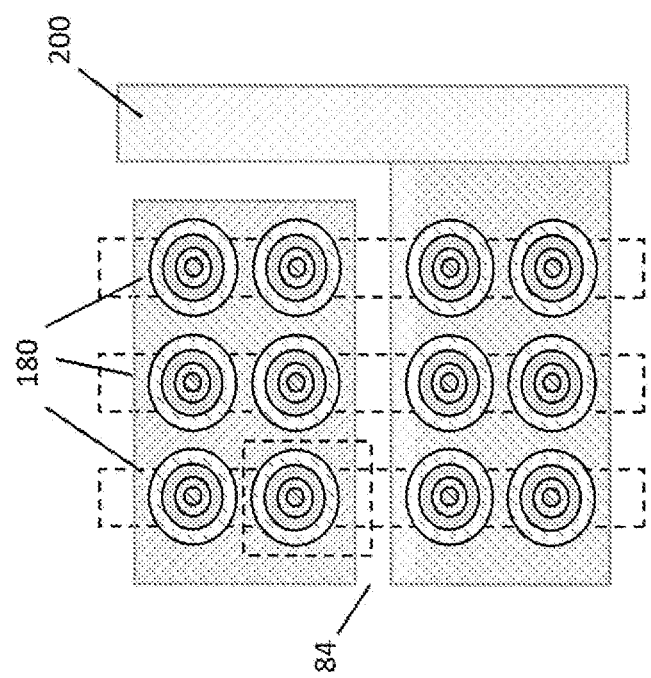

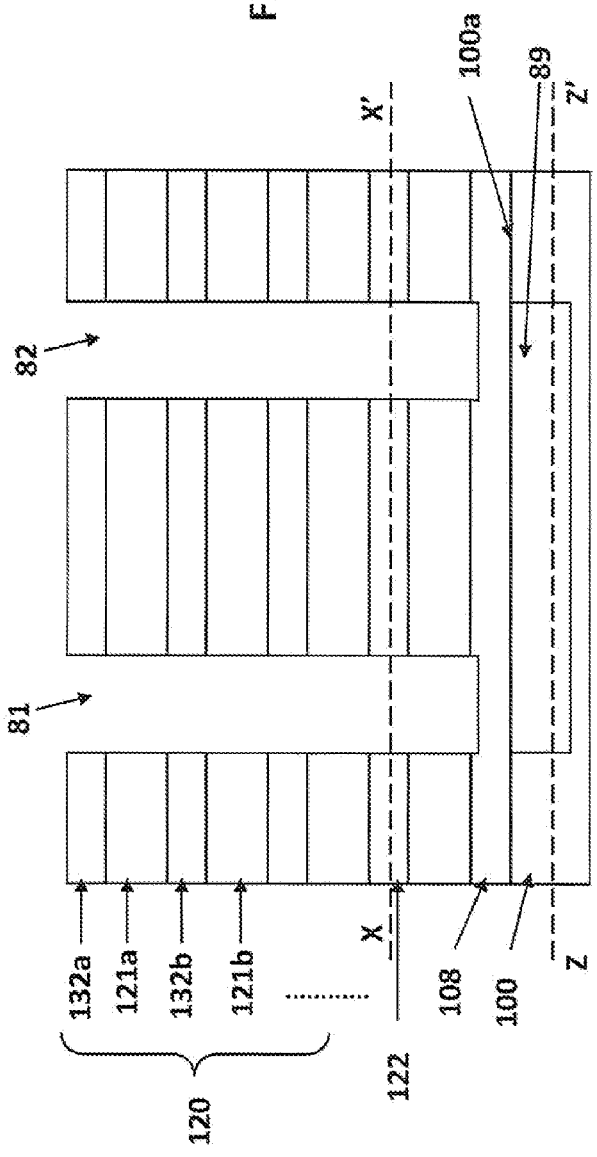
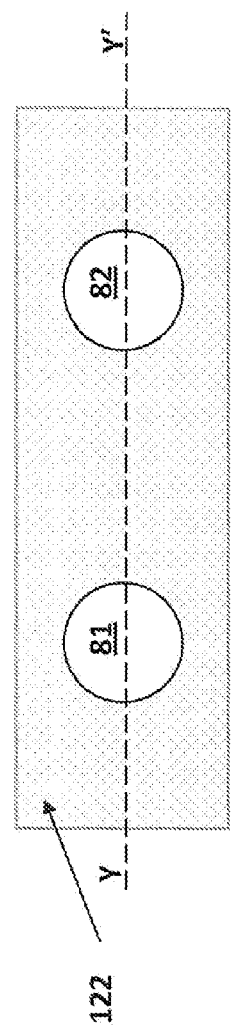
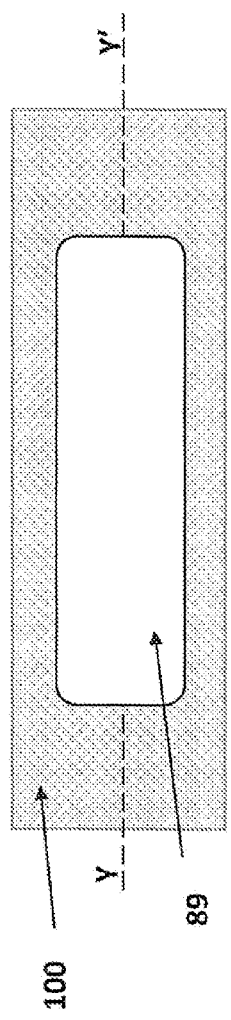

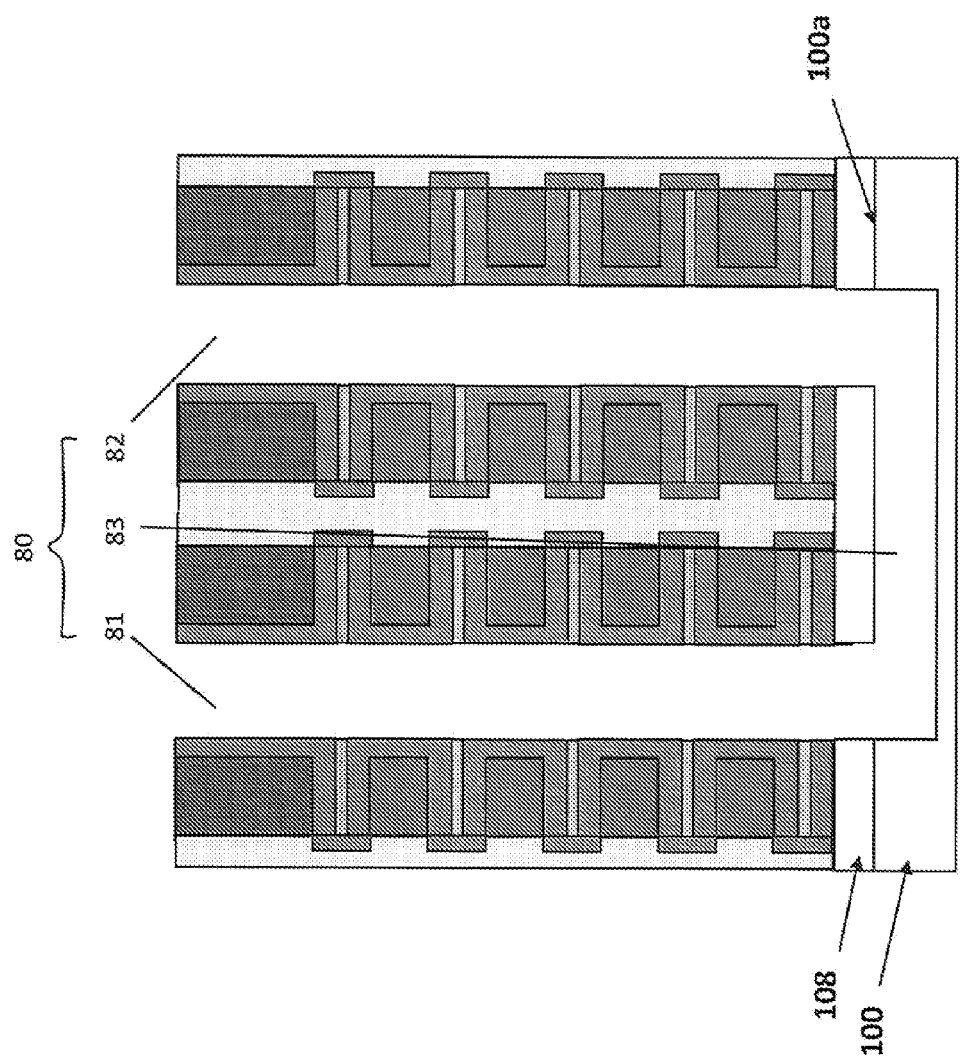

3D VERTICAL NAND AND METHOD OF MAKING THEREOF BY FRONT AND BACK SIDE PROCESSING

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a monolithic three dimensional NAND string. The method includes forming a stack of alternating layers of a first material and a second material over a substrate in which the first material comprises a conductive or semiconductor control gate material and the second material comprises a first sacrificial material. The method also includes etching the stack to form a back side opening in the stack, depositing a second sacrificial material in the back side opening, etching the stack to form a front side opening in the stack and selectively removing the second material through the front side opening to form first recesses. The method also includes forming a first blocking dielectric in the first recesses to partially fill the first recesses, forming a plurality of spaced apart dummy layer segments separated from each other in remaining unfilled portions of the first recesses over the first blocking dielectric, forming a charge storage material layer over the first blocking dielectric in the front side opening and forming a tunnel dielectric layer over the charge storage material layer in the front side opening. The method further includes forming a semiconductor channel layer over the tunnel dielectric layer in the front side opening, selectively removing the second sacrificial layer from the back side opening, selectively removing the plurality of dummy layer segments through the back side opening to expose the first recesses in the back side opening, selectively removing portions of the charge storage material layer through the back side opening and the first recesses to form a plurality of spaced apart charge storage segments and forming a second blocking dielectric in the first recesses and in between the spaced apart charge storage segments through the back side opening.

Another embodiment relates to a monolithic three dimensional NAND string. The NAND string includes a semiconductor channel with at least one end portion of the semiconductor channel extending substantially perpendicular to a major surface of a substrate. The NAND string also includes a plurality of control gate electrodes having a strip shape extending substantially parallel to the major surface of the substrate. The plurality of control gate electrodes include at least a first control gate electrode located in a first device level and a second control gate electrode located in a second device level located over the major surface of the substrate and below the first device level. The NAND string also includes a blocking dielectric comprising a plurality of first blocking dielectric segments. Each of the plurality of first blocking dielectric segments is located in contact with a respective one of the plurality of control gate electrodes. The NAND string further includes a plurality of spaced apart charge storage segments. The plurality of spaced apart charge storage segments comprise at least a first spaced apart charge storage segment located in the first device level and a second spaced apart charge storage segment located in the second device level. Further, the first spaced apart charge storage segment is separated from the second spaced apart charge storage segment by an air gap. The NAND string also includes a tunnel dielectric located between each one of the plurality of the spaced apart charge storage segments and the semiconductor channel.

BRIEF DESCRIPTION OF THE DRAWINGS

FIG. 1 is a side cross sectional view of an embodiment of a NAND string with a solid rod shaped channel.

FIG. 2 is a side cross sectional view of an embodiment of a NAND string with a hollow cylinder shaped channel.

FIG. 3 is a side cross sectional view of an embodiment of a NAND string with a U shaped solid channel.

FIG. 4 is a side cross sectional view of an embodiment of a NAND string with a U shaped hollow cylinder channel.

FIGS. 5-12 are side cross sectional views of a half of a NAND string (up to the dashed line) illustrating steps of the method of making a NAND string according to the first embodiment of the invention.

FIG. 13 is a top view of the device of FIG. 12.

FIGS. 14A-14C and 15-16 illustrate steps of a method of making a NAND string with a U-shaped channel FIG. 14A is a side cross sectional view. FIG. 14B is a top cross sectional view along line X-X' in the side cross sectional view shown in FIG. 14A, and FIG. 14C is a top cross sectional view along line Z-Z' in the side cross sectional view shown in FIG. 14A, while FIG. 14A is a side cross sectional view along line Y-Y' in the top cross sectional views shown in FIGS. 14B and 14C.

DETAILED DESCRIPTION

Figure 15:
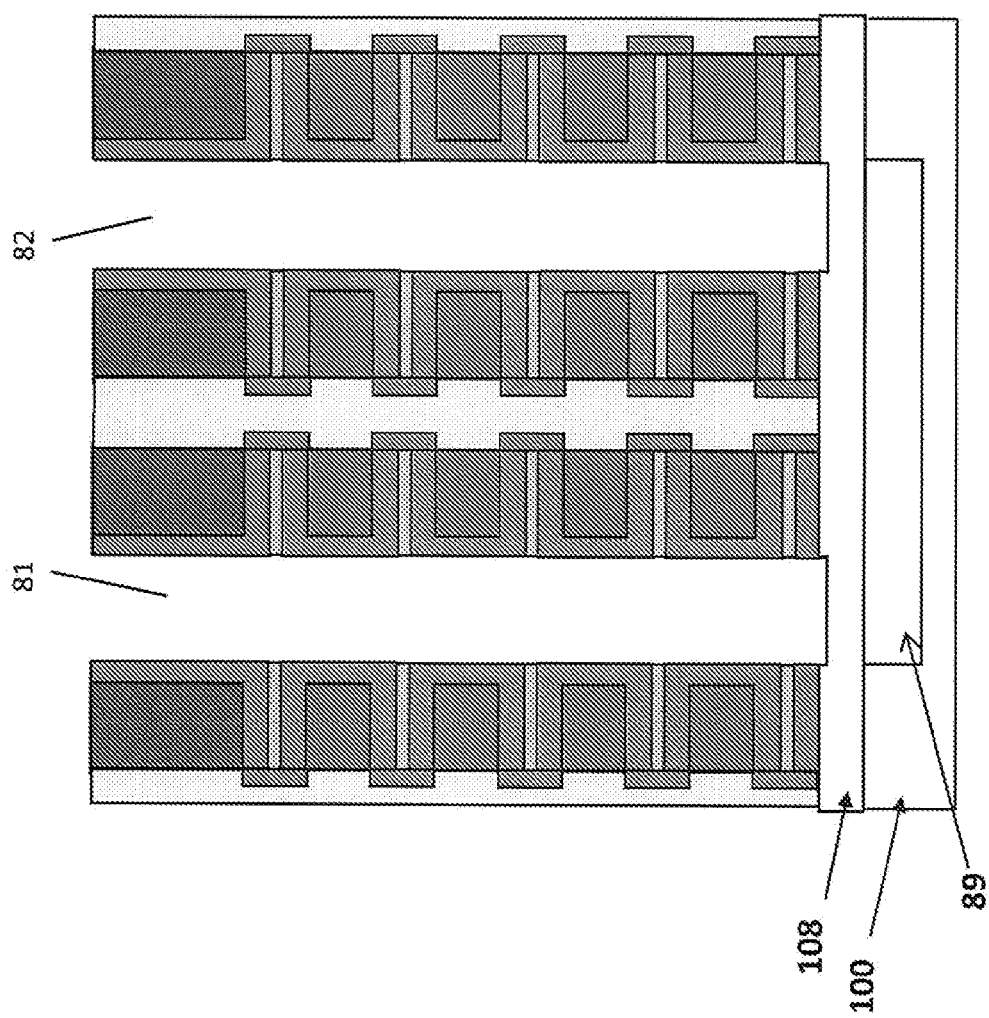

Embodiments include monolithic three dimensional NAND strings and methods of making three dimensional NAND strings. The methods include both front side and back side processing as will be explained below. Using the combination of front side and back side processing, a NAND string can be formed that includes an air gap between the floating gates in the NAND string. In an embodiment, the NAND string may be formed with a single vertical channel. In one aspect, the vertical channel has a solid, rod shape as shown in FIG. 1. In this aspect, the entire channel comprises a semiconductor material. In another aspect, the vertical channel has a hollow cylinder shape as shown in FIG. 2. In this aspect, the vertical channel includes a non-semiconductor core surrounded by a semiconductor channel shell. The core may be unfilled or filled with an insulating material, such as silicon oxide or silicon nitride. Alternatively, the NAND string may have a U shape (also known as a "pipe" shape) with two vertical channel wing portions connected with a horizontal channel connecting the wing portions. In one aspect, the U shaped or pipe shaped channel may be solid, as in the solid rod shaped vertical channel NAND as shown in FIG. 3. In another aspect, the U shaped or pipe shaped channel may be hollow cylinder shaped, as in the hollow cylinder pipe shaped vertical channel NAND as shown in FIG. 4. The U-shaped pipe channel may be filled or unfilled. Separate front side and back side methods for fabricating both single vertical channel and U shaped channel NAND strings are taught in co-pending U.S. patent application Ser. No. 12/827,947, hereby incorporated by reference in its entirety for teaching of the separate front and back side processing methods.

In some embodiments, the monolithic three dimensional NAND string 180 comprises a semiconductor channel 1 having at least one end portion extending substantially perpendicular to a major surface 100a of a substrate 100, as shown in FIGS. 1-4. For example, the semiconductor channel 1 may have a pillar shape and the entire pillar-shaped semiconductor channel extends substantially perpendicularly to the major surface of the substrate 100, as shown in FIGS. 1 and 2. In these embodiments, the source/drain electrodes of the device can include a lower electrode 102 provided below the semiconductor channel 1 and an upper electrode 202 formed over the semiconductor channel 1, as shown in FIGS. 1 and 2. Alternatively, the semiconductor channel 1 may have a U-shape, as shown in FIGS. 3 and 4. The two wing portions 1a and 1b of the U-shape semiconductor channel may extend substantially perpendicular to the major surface 100a of the substrate 100, and a connecting portion 1c of the U-shape semiconductor channel 1 connects the two wing portions 1a, 1b extending substantially perpendicular to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors 16 are shown in FIGS. 3 and 4. These transistors and their operation are described U.S. patent application Ser. No. 12/827,947, which is incorporated by reference for a teaching of the select transistors.

In some embodiments, the semiconductor channel 1 may be a solid semiconductor rod, such as a cylinder or rod, as shown in FIGS. 1 and 3. In some other embodiments, the semiconductor channel 1 may be hollow, for example a hollow semiconductor cylinder filled with an insulating fill material 2, as shown in FIGS. 2 and 4.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, indium antimonide, or other compound semiconductor materials, such as III-V or II-VI semiconductor materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1-4. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof. For example, in some embodiments, polysilicon is preferred to allow easy processing.

A blocking dielectric 7 is located adjacent to and may be surrounded by the control gate(s) 3. The blocking dielectric 7 may comprise a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIGS. 1-4. In some embodiments, at least a portion of each of the plurality of blocking dielectric segments 7 has a clam shape.

As used herein a "clam" shape is a side cross sectional shape configured similar to an English letter "C". A clam shape has two segments which extend substantially parallel to each other and to the major surface 100a of the substrate 100. The two segments are connected to each other by a third segment which extends substantially perpendicular to the first two segments and the surface 100a. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration. The clam shape preferably contains an opening bounded by the three segments and having a fourth side open. The opening may be filled by another material or layer.

The monolithic three dimensional NAND string also comprise a plurality of discrete charge storage segments 9 located between the channel 1 and the blocking dielectric 7. Similarly, the plurality of discrete charge storage segments 9 comprise at least a first discrete charge storage segment 9a located in the device level A and a second discrete charge storage segment 9b located in the device level B.

The tunnel dielectric 11 of the monolithic three dimensional NAND string is located between each one of the plurality of the discrete charge storage segments 9 and the semiconductor channel 1. In embodiments described in more detail below, the tunnel dielectric 11 has a uniform thickness and/or a straight sidewall.

The blocking dielectric 7 and the tunnel dielectric 11 may be independently selected from any one or more same or different electrically insulating materials, such as silicon oxide, silicon nitride, silicon oxynitride, or other high-k insulating materials.

The discrete charge storage segments 9 may comprise a conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate, conductive nanoparticles, or a discrete charge storage dielectric (e.g., silicon nitride or another dielectric) feature. For example, in some embodiments, the discrete charge storage segments 9 are discrete charge storage dielectric features, each of which comprises a nitride feature 9, where the silicon oxide blocking dielectric segment 7, the nitride feature 9 and the silicon oxide tunnel dielectric 11 form oxide-nitride-oxide discrete charge storage structures of the NAND string. In some of the following description, a polysilicon floating gate is used as a non-limiting example. However, it should be understood that a dielectric charge storage feature or other floating gate material may be used instead.

Single Vertical Channel NAND String Embodiments

FIGS. 5-13 illustrate a method of making a NAND string according to a first embodiment of the invention.

Referring to FIG. 5, a stack 120 of alternating layers 121 (121a, 121b, etc.) and 132 (132a, 132b etc.) is formed over the major surface of the substrate 100. Layers 121, 132 may be deposited over the substrate by any suitable deposition method, such as sputtering, CVD, MBE, etc. The layers 121, 132 may be 6 to 100 nm thick. The stack 120 may be covered with a top layer of insulating material 200, such as silicon nitride.

In this embodiment, the first layers 121 comprise a first conductive (e.g., metal or metal alloy) or semiconductor (e.g., heavily doped n+ or p+ polysilicon) control gate material, and the second layers 132 comprise a first sacrificial material. The term heavily doped includes semiconductor materials doped n-type or p-type to a concentration of above $10^{18}$ cm$^{-3}$. Any sacrificial material 132 that can be selectively etched compared to material 121 may be used, such as conductive or insulating or semiconducting material. For example, the sacrificial material 132 may be silicon-germanium or intrinsic polysilicon when material 121 is p+ polysilicon.

The deposition of layers 121, 132 is followed by etching the stack 120 to form at least one back side opening 84 and at least one front side opening 81 in the stack 120. The openings 81, 84 may be formed by forming a mask (e.g., a photoresist mask) by photolithography followed by etching unmasked areas. The opening 84 may be in the shape of a cut traversing more than one NAND string as illustrated in FIG. 13. An array of front side openings 81 may be formed in locations where vertical channels of NAND strings will be subsequently formed and one or more back side openings 84 may be formed near the front side openings 81 to allow back side access to the vertical NAND strings located in the front side openings 81. A second sacrificial layer 134 is deposited in the back side openings or cut 84. In an embodiment, openings or cut(s) 84 are formed in the stack 120 first and filled with sacrificial material 134. Then, the front side openings 81 are formed in the stack. The order of steps, however, may be reversed. Any sacrificial material 134 that can be selectively etched compared to material 121 may be used, such as conductive or insulating or semiconducting material. For example, the sacrificial material 134 may be silicon oxide when material 121 is p+ polysilicon.

Next, as shown in FIG. 6, the first sacrificial material 132 is selectively etched compared to the first material 121 and second sacrificial layer 134 to form first recesses 62. The first recesses 62 may be formed by selective, isotropic wet or dry etching which selectively etches the first sacrificial material 132 compared to the first conductive material 121 through front side openings 81. The recess 62 extends to the second sacrificial layer 134. Preferably, the entire layers of first sacrificial material 132 between the layers of first conductive material 121 are removed up to the second sacrificial layer 134.

An optional second selective etch may be performed to extend the first recesses 62 into the second sacrificial layer 134. Alternatively, the first selective etch process is continued rather than performing a second selective etch if the etchant is capable of selectively etching the first and second sacrificial materials 132, 134 relative to the first conductive material 121. In this case, the top of the second sacrificial layer 134 is covered by a mask during etching.

A blocking dielectric 7 (also known as an inter-poly dielectric, IPD) is then formed in the openings 81 such that the blocking dielectric coats the sides of the first recesses 62, resulting in a structure as shown in FIG. 7. In an embodiment, the blocking dielectric 7 completely fills the portion of recess 62 in the second sacrificial layer 134 and partially fills the recesses 62 between the first conductive material 121 in the stack 120. The blocking dielectric 7 may comprise a silicon oxide layer deposited by conformal atomic layer deposition (ALD) or chemical vapor deposition (CVD). Other high-k dielectric materials, such as hafnium oxide, may be used instead or in addition to silicon oxide. Dielectric 7 may have a thickness of 6 to 20 nm. The blocking dielectric 7 comprises a plurality of clam-shaped blocking dielectric segments (e.g., blocking dielectric segments 7a and 7b) in the first recesses 62 between overhanging portions of the first conductive material 121.

Next, as illustrated in FIG. 8, a third sacrificial layer 136 is deposited in the recesses 62. The third sacrificial layers 136 form dummy layer segments separated from each other in the remaining unfilled portions of recesses 62. The third sacrificial layer 136 may be, but is not limited to, a conductive material, such as titanium nitride or another metal or metal alloy, or doped polysilicon of a different conductivity type (e.g., n+ or intrinsic) from the control gate material 136 (e.g., p+ or polysilicon). The control gate material 136 may be any material that can be selectively etched compared to the blocking dielectric 7 and the conformal insulating layer 138 (described below). In an embodiment, the third sacrificial layer 136 completely fills the remaining portions of the recess 62.

In the next step, illustrated in FIG. 9, the opening 81 is then sequentially filled with a series of layers. First, an optional conformal layer of insulating material 138 is deposited in the opening 81. The conformal insulating layer 138 may deposited by ALD or CVD. Suitable materials for the conformal insulating layer include nitrides (such as silicon nitride), oxides (such as silicon oxide) and other high-k dielectric materials. The conformal insulating layer 138 may have a thickness of 1-5 nm. A layer of charge storage material 9 (e.g., n+ poly) may then be conformally deposited on top of the conformal insulating layer 138 in the opening 81. The charge storage material 9 is then followed by a layer of dielectric material 11 suitable for forming a tunnel dielectric 11. The tunnel dielectric may comprise a relatively thin insulating layer (e.g., 4 to 10 nm thick) of silicon oxide or other suitable material, such as oxynitride, oxide and nitride multi layer stacks, or a high-k dielectric (e.g., hafnium oxide). The tunnel dielectric may be deposited by any suitable method, such as ALD, CVD, etc.

A semiconductor channel material 1 is then formed in the front side opening 81. The channel may comprise any suitable semiconductor material, such as silicon, germanium, silicon germanium, indium antimonide or any other compound semiconductor material. In some embodiments, the semiconductor channel material 1 completely fills the opening 81 with a semiconductor channel material, as shown in FIG. 9. Alternatively, the step of forming the semiconductor channel 1 in the opening forms a semiconductor channel material 1 on the side wall(s) of the opening 81 but not in a central part of the opening 81 such that the semiconductor channel material 1 does not completely fill the opening 81. In these alternative embodiments, an insulating fill material 2 is formed in the central part of the at least one opening 81 to completely fill the at least one opening 81, as shown in FIG. 2. Preferably, the channel material 1 comprises lightly doped p-type or n-type (i.e., doping below $10^{17}$ cm$^{-3}$) silicon material. An n-channel device is preferred since it is easily connected with n+ junctions. However, a p-channel device may also be used.

The semiconductor channel 1 may be formed by any desired methods. For example, the semiconductor channel material 1 may be formed by depositing semiconductor (e.g., polysilicon) material in the opening 81 and over the stack 120, followed by a step of removing the upper portion of the deposited semiconductor layer by chemical mechanical polishing (CMP) or etchback using top surface of the stack 120 as a polish stop or etch stop.

In some embodiments, a single crystal silicon or polysilicon vertical channel 1 may be formed by metal induced crystallization ("MIC", also referred to as metal induced lateral crystallization) without a separate masking step. The MIC method provides full channel crystallization due to lateral confinement of the channel material in the opening 81.

In the MIC method, an amorphous or small grain polysilicon semiconductor (e.g., silicon) layer can be first formed in the at least one opening 81 and over the stack 120, followed by forming a nucleation promoter layer over the semiconductor layer. The nucleation promoter layer may be a continuous layer or a plurality of discontinuous regions. The nucleation promoter layer may comprise any desired polysilicon nucleation promoter materials, for example but not limited to nucleation promoter materials such as Ge, Ni, Pd, Al or a combination thereof.

The amorphous or small grain semiconductor layer can then be converted to a large grain polycrystalline or single crystalline semiconductor layer by recrystallizing the amorphous or small grain polycrystalline semiconductor. The recrystallization may be conducted by a low temperature (e.g., 300 to 600° C.) anneal.

The upper portion of the polycrystalline semiconductor layer and the nucleation promoter layer can then be removed by CMP or etchback using top surface of the stack 120 as a stop, resulting in the structure as shown in FIG. 9. The removal may be conducted by selectively wet etching the remaining nucleation promoter layer and any formed silicide in the top of layer following by CMP of the top of silicon layer using the top of the stack 120 as a stop.

The second sacrificial layer 134 is then removed from the back side openings 84 exposing the third sacrificial layers 136 in the recesses 62. Further, the third sacrificial layers 136 are removed from the recesses 62 through the back side openings 84. The resulting structure is illustrated in FIG. 10. Removal of the second and third sacrificial layers 134, 136 may be accomplished in a single sacrificial etch step or with two separate etch steps. In this step, the conformal insulating layer 138 acts as an etch stop, preventing the dissolution of materials in the openings 81.

In the next step, illustrated in FIG. 11, a portion of the conformal insulating layer 138 and a portion of the charge storage layer 9 are removed through the back side openings 84 and the recesses 62 wherein the third sacrificial layer 136 was removed to form recesses 63. In this manner, separate, discrete charge storage elements 9a-9d in each device level are produced. Removal of a portion of the conformal insulating layer 138 may be accomplished, for example, by selective wet etching in one or more steps. For example, a first etchant may be used to selectively etch the conformal insulating layer 138 and a second etchant used to selectively etch the charge storage layer 9. If desired, an optional channel grain boundary passivation anneal may be conducted on the structure shown in FIG. 11 to passivate the channel grain boundaries. The anneal may be conducted in a hydrogen, oxygen and/or nitrogen containing ambient (e.g., forming gas ambient) at a temperature of 600 to 1000° C. The ambient reaches the channel 1 through the back side opening 84 and the open recesses 62 and 63. If the channel 1 comprises a hollow cylinder shown in FIGS. 2 and 4, then this anneal may be conducted at any time before the insulating fill material 2 is provided into the middle of the hollow channel.

FIG. 12 illustrates the formation of an enclosed air gap 300 between the discrete charge storage elements 9a-9d. In this step, dielectric material 302 is deposited in the recesses 63 and the recesses 62. Deposition is preferably performed with a conformal deposition process such as ALD or CVD though the back side openings 84. A uniform layer of material is deposited on the walls of the recess 63 and in the recess 62. When the recess 62 fills with material, the deposition process stops since the connection between back side openings 84 and recesses 63 is filled. Because the recess 63 is larger than the recess 62, an air gap remains in the recess 63. Thus, the discrete charge storage elements 9a-9d are separated from each other with a composite structure that includes dielectric material 302 and the air gap 300. The air gap 300 advantageously provides better isolation between regions 9 than insulating material alone. The dielectric material 300 may be the same material as the blocking dielectric 7, e.g. $SiO_2$. Alternatively, the dielectric material may comprise a different material than that of the blocking dielectric 7, e.g. silicon nitride.

Thus, all NAND layers except insulating layer 302 and air gap 300 are formed by front side (i.e., channel side) processing through front side opening 81 while insulating layer 302 (and thus the air gap 300) are formed via back side processing through back side opening 84.

An upper electrode 202 may be formed over the semiconductor channel 1, resulting in a structure shown in FIG. 1 or 2. In these embodiments, a lower electrode 102 may be provided below the semiconductor channel 1 prior to the step of forming the stack 120 over the substrate 100. The lower electrode 102 and the upper electrode may be used as the source/drain electrodes of the NAND string.

U-Shaped Channel NAND String Embodiments

In the U-shaped channel embodiments, the source/drain electrodes of the NAND string can both be formed over the semiconductor channel 1 and the channel 1 has a U-shape, for example as shown in FIGS. 3 and 4. In these embodiments, an optional body contact electrode (as will be described below) may be disposed on or in the substrate 100 to provide a body contact to the connecting portion of the semiconductor channel 1 from below.

As used herein a "U-shape" side cross sectional shape configured similar to an English letter "U". This shape has two segments (referred to herein as "wing portions") which extend substantially parallel to each other and substantially perpendicular to the major surface 100a of the substrate 100. The two wing portions are connected to each other by a connecting segment or portion which extends substantially perpendicular to the first two segments and substantially parallel to the surface 100a. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration.

The substrate 100 shown in FIG. 14 may comprise a semiconductor substrate optionally containing embedded conductors and/or various semiconductor devices. Alternatively, the substrate 100 may comprise an insulating or semiconductor layer optionally containing embedded conductors.

First, a sacrificial feature 89 may be formed in and/or over the substrate 100, prior to the step of forming the stack 120 of alternating layers of the first material and second materials over the at least one sacrificial feature 89. The sacrificial feature 89 may be formed of any suitable sacrificial material which may be selectively etched compared to the other materials in the stack 120 and in the NAND string, such as an organic material, silicon nitride, tungsten, etc. Feature 89 may have any suitable shape which is similar to the desired shape of the connecting segment of the U-shape as will be described below.

An insulating protective layer 108 may be formed between the sacrificial feature 89 and the stack 120. For example, layer 108 may comprise silicon oxide if feature 89 comprises silicon nitride. Further, at least two front side openings 81 and 82 are then formed in the stack 120, resulting in a structure shown in FIG. 14A. FIG. 14B shows a top cross sectional view along line X-X' in FIG. 14A. FIG. 14C shows a top cross sectional view along line Z-Z' in FIG. 14A. FIG. 14A is a side cross sectional view along line Y-Y' in FIGS. 14B and 14C. The openings 81 and 82 are formed above the sacrificial feature 89, as illustrated in FIGS. 14A-C. In some embodiments, the semiconductor channel has a cross section of two circles when viewed from above, as shown in FIGS. 13 and 14B. Preferably, the protective layer 108 is used as a stop for the etching of the openings 81, 82 such that the top of layer 108 forms the bottom surface of the openings 81, 82.

The same or similar methods described above in the single vertical channel embodiments and illustrated in FIGS. 5-13 can then be used to form the intermediate structure shown in FIG. 15. In this structure, the front side processing as illustrated in FIGS. 5-8 have been performed.

Turning to FIG. 16, the at least one sacrificial feature 89 is then removed to form a hollow region 83 where the feature 89 was located. The hollow region 83 extends substantially parallel to a major surface 100a of the substrate 100, and connects the at least two openings 81 and 82, forming a hollow U-shaped space 80. The hollow region 83 may be formed by further etching the openings 81, 82 (e.g., by anisotropic etching) such that these openings extend through the protective layer 108 to expose the sacrificial feature 89. The sacrificial feature 89 material is then selectively etched using a selective wet or dry etch which selectively removes the sacrificial feature material without substantially etching material 122, blocking dielectric 7 and charge storage segments 9.

After forming the U-shaped space 80, a NAND string 180 may fabricated as follows. A charge storage material layer 9 is formed over the first blocking dielectric 7 in the first and second front side openings 81, 82 and in the hollow region 83. A tunnel dielectric layer 11 is then deposited over the charge storage material layer 9 in the first and second front side openings 81, 82 and in the hollow region 83. The semiconductor channel layer 1 is then formed over the tunnel dielectric layer 11, similar to steps shown in FIG. 9.

Next the second sacrificial layer 134 is selectively removed from the back side openings 84 followed by selectively removing the dummy layer segments of third sacrificial layer 136 through the back side opening 84 to expose the recesses 62 via the second back side openings 84 similar to the steps shown in FIG. 10. Next, portions of the charge storage material layer 9 are selectively removed through the back side openings 84 and the recesses 62 to form a plurality of spaced apart charge storage segments 9 separated by recesses 63, similar to the steps shown in FIG. 11. A blocking dielectric is then deposited in the recesses 62 and between the spaced apart charge storage segments 9 in recesses 63 through the back side openings 84, similar to FIG. 12. To complete the NAND string 180, a source electrode $202_1$ is formed contacting the semiconductor channel wing 1a located in opening 81 and a drain electrode $202_2$ is formed contacting the semiconductor channel wing 1b located in opening 82 as shown in FIGS. 3 and 4. Optionally, a body contact electrode 18 may be formed below the stack, as shown in FIG. 3. The body contact electrode preferably contacts a portion of the semiconductor channel layer located in the hollow region 83.

In an embodiment, the semiconductor channel layer 1 has a cross section above the hollow space of two circles when viewed from above, as shown in FIGS. 13 and 14b.

In an embodiment, the semiconductor channel material 1 completely fills the openings 81 and 82, as shown in FIG. 3. Alternatively, the step of forming the semiconductor channel 1 in the openings 81, 82 forms a semiconductor channel material 1 on the side wall(s) of the openings 81, 82 but not in a central part of the openings such that the semiconductor channel material 1 does not completely fill the openings. In these alternative embodiments, an insulating fill material 2 is formed in the central part of the openings 81, 82 to completely fill the openings 81, 82 as shown in FIG. 4.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a monolithic three dimensional NAND string, comprising:

forming a stack of alternating layers of a first material and a second material over a substrate, wherein the first material comprises a conductive or semiconductor control gate material and wherein the second material comprises a first sacrificial material;

etching the stack to form a back side opening in the stack;

depositing a second sacrificial material in the back side opening;

etching the stack to form a front side opening in the stack;

selectively removing the second material through the front side opening to form first recesses;

forming a first blocking dielectric in the first recesses to partially fill the first recesses;

forming a plurality of spaced apart dummy layer segments separated from each other in remaining unfilled portions of the first recesses over the first blocking dielectric;

forming a charge storage material layer over the first blocking dielectric in the front side opening;
forming a tunnel dielectric layer over the charge storage material layer in the front side opening;
forming a semiconductor channel layer over the tunnel dielectric layer in the front side opening;
selectively removing the second sacrificial layer from the back side opening;
selectively removing the plurality of dummy layer segments through the back side opening to expose the first recesses in the back side opening;
selectively removing portions of the charge storage material layer through the back side opening and the first recesses to form a plurality of spaced apart charge storage segments; and
forming a second blocking dielectric in the first recesses and between the spaced apart charge storage segments through the back side opening.

2. The method of claim 1, wherein the step of forming the second blocking dielectric between the spaced apart charge storage segments partially fills spaces between the spaced apart charge storage segments to leave an air gap between adjacent charge storage segments.

3. The method of claim 1, further comprising:
etching second recesses in the second sacrificial material through the first recesses after the step of selectively removing the second material;
forming the first blocking dielectric in the second recesses during the step of forming the first blocking dielectric in the first recesses;
selectively removing the first blocking dielectric from the second recesses through the back side opening after the step of selectively removing the second sacrificial layer from the back side opening and before the step of selectively removing the plurality of dummy layer segments; and
performing a channel grain boundary passivation anneal in at least one of hydrogen, oxygen or nitrogen containing ambient after the step of selectively removing portions of the charge storage material, such that the ambient reaches the channel through the back side opening and through the first recesses.

4. The method of claim 1, further comprising:
forming an etch stop layer over the first blocking dielectric and the plurality of dummy layer segments in the front side opening prior to the step of forming the charge storage material layer, such that the step of forming the charge storage material layer forms the charge storage material layer on the etch stop layer in the front side opening; and
selectively removing portions of the etch stop layer through the back side opening after the step of selectively removing the plurality of dummy layer segments and before the step of selectively removing portions of the charge storage material layer.

5. The method of claim 1, wherein:
at least one end portion of the semiconductor channel extends vertically in a substantially perpendicular direction to a major surface of the substrate; and
the plurality of spaced apart charge storage segments comprise a plurality of vertically spaced apart floating gates or a plurality of vertically spaced apart dielectric charge storage segments.

6. The method of claim 1, wherein the step of forming the semiconductor channel layer in the front side opening completely fills the front side opening with the semiconductor channel layer.

7. The method of claim 1, wherein the step of forming the semiconductor channel layer in the front side opening forms the semiconductor channel layer on a side wall of the front side opening but not in a central part of the front side opening such that the semiconductor channel layer does not completely fill the front side opening.

8. The method of claim 7, further comprising forming an insulating fill material in the central part of the front side opening to completely fill the front side opening.

9. The method of claim 1, furthering comprising forming an upper electrode over the semiconductor channel.

10. The method of claim 9, furthering comprising providing a lower electrode below the semiconductor channel layer prior to forming the stack.

11. The method of claim 1, wherein:
the conductive or semiconductor control gate material comprises doped polysilicon of a first conductivity type;
the first sacrificial material comprises silicon germanium or intrinsic polysilicon;
the semiconductor channel layer comprises lightly doped or intrinsic polysilicon;
the second sacrificial material comprises silicon oxide or silicon nitride;
the plurality of spaced apart dummy layer segments comprise titanium nitride or doped polysilicon of a second conductivity type; and
the charge storage material layer comprises doped polysilicon of the second conductivity type.

12. The method of claim 1, further comprising:
forming a sacrificial feature over the substrate prior to the step of forming the stack, such that the stack is formed over the sacrificial feature;
etching the stack to form a second back side opening in the stack;
depositing the second sacrificial material in the second back side opening during the step of depositing the second sacrificial material;
etching the stack to form a second front side opening in the stack;
selectively removing the second material through the second front side opening to form third recesses;
forming the first blocking dielectric in the third recesses to partially fill the third recesses;
forming a second plurality of spaced apart dummy layer segments separated from each other in remaining unfilled portions of the third recesses over the first blocking dielectric;
selectively removing the sacrificial feature to form a hollow region extending substantially parallel to a major surface of the substrate which connects front side opening to the second front side opening to form a hollow U-shaped pipe space comprising the front side opening and the second front side opening extending substantially perpendicular to the major surface of the substrate connected by the hollow region;
forming the charge storage material layer over the first blocking dielectric in the second front side opening and in the hollow region;
forming the tunnel dielectric layer over the charge storage material layer in the second front side opening and in the hollow region;
forming the semiconductor channel layer over the tunnel dielectric layer in the second front side opening and in the hollow region;
selectively removing the second sacrificial layer from the second back side opening;

selectively removing the second plurality of dummy layer segments through the second back side opening to expose the third recesses in the second back side opening;

selectively removing portions of the charge storage material layer through the second back side opening and the third recesses to form a second plurality of spaced apart charge storage segments; and forming a second blocking dielectric in the third recesses and between the second spaced apart charge storage segments through the second back side opening.

13. The method of claim 12, wherein the semiconductor channel layer has a cross section above the hollow space of two circles when viewed from above.

14. The method of claim 13, furthering comprising:

forming a source electrode contacting the semiconductor channel layer located in the front side opening;

forming a drain electrode contacting the semiconductor channel layer located in the second front side opening; and forming a body contact electrode below the stack, wherein the body contact electrode contacts a portion of the semiconductor channel layer located in the hollow region.

* * * * *